United States Patent
Park et al.

[11] Patent Number: 6,087,257
[45] Date of Patent: Jul. 11, 2000

[54] METHODS OF FABRICATING A SELECTIVELY DEPOSITED TUNGSTEN NITRIDE LAYER AND METAL WIRING USING A TUNGSTEN NITRIDE LAYER

[75] Inventors: Byung-lyul Park; Jung-min Ha, both of Seoul; Dae-hong Ko; Sang-in Lee, both of Kyungki-do, all of Rep. of Korea

[73] Assignee: Samsung Electronics Co., Ltd., Rep. of Korea

[21] Appl. No.: 08/751,153

[22] Filed: Nov. 15, 1996

[51] Int. Cl.[7] .................................................. H01L 21/44
[52] U.S. Cl. ............................ 438/675; 438/680; 438/685
[58] Field of Search .................................... 438/756, 203, 438/190, 629, 641, 674, 675, 680, 685, 909, 935

[56] References Cited

U.S. PATENT DOCUMENTS

| | | | |
|---|---|---|---|
| 3,887,993 | 6/1975 | Okada et al. | 29/571 |
| 4,847,111 | 7/1989 | Chow et al. | 427/38 |
| 4,902,645 | 2/1990 | Ohba | 438/200 |
| 5,219,789 | 6/1993 | Adan | 438/192 |
| 5,429,989 | 7/1995 | Fiordalice | 438/203 |
| 5,487,923 | 1/1996 | Min et al. | 427/569 |
| 5,691,235 | 11/1997 | Meikle et al. | 438/190 |
| 5,723,384 | 3/1998 | Park et al. | 438/756 |
| 5,739,579 | 4/1998 | Chiang et al. | 257/635 |

FOREIGN PATENT DOCUMENTS

| | | | |
|---|---|---|---|
| 3-220720 | 9/1991 | Japan | 21/28 |

OTHER PUBLICATIONS

Applicants admitted prior art, pp. 1–5.

European Search Report of EP 96 30 8176, dated Apr. 17, 1997 by N. Schuermans.

Marcus, Steve D. and Foster, R. F., Characterization of low pressure chemically vapor–deposited tungsten nitride films, *Thin Solid Films*, 236, pp. 330–333 (1993).

Lee, Chang Woo, et al., Performance of the plasma deposited tungsten nitride barrier to prevent the interdiffusion of Al and Si, *J. Vac. Sci. Technology B*, pp. 69–72 (Jan./Feb. 1994), Feb. 1, 1994.

Nakajimi, Tsuyoshi, et al, Preparation of Tungsten Nitride Film by CVD Method Using $WF_6$, *J. Electrochem. Soc.: Solid–State Science and Technology*, 2, pp. 3175–3178 (Sep. 9, 1997).

*Primary Examiner*—Wael Fahmy
*Assistant Examiner*—Kurt Eaton
*Attorney, Agent, or Firm*—Myers Bigel Sibley & Sajovec

[57] ABSTRACT

Methods for fabricating a tungsten nitride layer in a semiconductor substrate having an insulating layer formed thereon. The methods include forming a contact hole through the insulating layer. A tungsten nitride layer is then selectively deposited only in the contact hole by selectively reacting a nitrogen-containing gas with a tungsten source gas so as to prevent formation of tungsten nitride layer on the insulating layer outside the contact hole. Methods or fabricating metal wiring utilizing the methods of fabricating a tungsten nitride layer are also provided.

24 Claims, 11 Drawing Sheets

METHODS OF FABRICATING A SELECTIVELY DEPOSITED TUNGSTEN NITRIDE LAYER AND METAL WIRING USING A TUNGSTEN NITRIDE LAYER

FIELD OF THE INVENTION

The present invention relates to a methods for fabricating semiconductor devices, and more particularly, to a method for fabricating conductive layers in semiconductor devices.

BACKGROUND OF THE INVENTION

With an increase in the integration level of semiconductor integrated circuits (ICs), the width of metal interconnection lines generally decreases. Additionally, the aspect ratio (the ratio of depth to width) of a contact hole or via generally continues to increase because a proportionate decrease in contact depth is typically not realized with the decrease in interconnection metal width. With the increase in aspect ratio, aluminum (Al) alloy films currently used as the material for metal wiring may show poor step coverage in a contact hole or may have a void in the contact hole resulting from the sputter-formation of the Al. As a result of these possible limitations of Al, an open may occur between metal interconnection lines which lowers the reliability of the IC.

Recently, in light of the limitations of Al as an interconnect metal, the use of tungsten (W) as an interconnect material has attracted attention. FIGS. 1A through 1E illustrate a method for forming a tungsten layer by chemical vapor deposition (CVD).

In FIG. 1A, an impurity region 12 which defines a source/drain region is formed by implanting ions into a silicon substrate 10. Then, a silicon oxide layer is formed as an insulating layer 13 to a thickness of 500–2000 Å on the overall surface of the substrate 10 including the impurity region 12. As shown in FIG. 1B, a trench 19 for forming a metal wiring therein is formed by etching the insulating layer 13 and the silicon substrate 10 to a predetermined depth.

Subsequently, a titanium (Ti) layer is deposited to a thickness of 200–1500 Å on the insulating layer 13 and in the trench 19 and then thermally treated. As a result of the thermal treatment, the silicon substrate 10 reacts with the Ti layer to form a titanium silicide ($TiSi_x$) layer 14. The titanium silicide layer acts as an ohmic layer on the contact surface with the substrate. The remaining Ti which did not react with the substrate is removed by wet etching which results in the configuration shown in FIG. 1C.

As shown in FIG. 1D, after etching, a titanium nitride (TiN) layer is deposited as a diffusion-barrier layer 15 to a thickness of 150–900 Å and a tungsten layer 16 is deposited on the diffusion-barrier layer 15 to a thickness of 1000 Å or more. After deposition, the diffusion-barrier layer and the tungsten layer are etched back by chemical mechanical polishing (CMP) so that the tungsten layer 16 remains only in the trench 19 as shown in FIG. 1E, thus, completing the metal wiring.

One difficulty which may arise as a result of the structure described above results from the differing physical characteristics of the materials which make up the SCVD-W metal wiring. When metal wiring is formed by SCVD-W, the TiN layer, which acts as a diffusion-barrier layer, has physical properties, for example, tensile force, which differ from those of the W layer used as the metal wiring layer. Thus, the interface between the TiN and W layers may be highly stressed. Consequently, the tungsten layer may lift from the adjacent layers or the TiN layer/W layer may lift from the insulation layer during CMP or other processing steps in which physical force is applied to the structure. This lifting may cause a loss of contact between the layers and result in an undesired open electrical condition in the wiring.

Another possible difficulty with the above structure may arise, when the impurity region is formed using boron (B) as a $P^+$ impurity. In such a case, the impurity may react with Ti in a subsequent thermal process, thus forming $TiB_2$. As a result, the ohmic contact characteristics may be degraded which may cause the contact resistance to increase.

To overcome the above problem, a method as shown in FIG. 2A has been suggested in which a tungsten layer 24 is formed as an ohmic layer and a tungsten nitride layer 25 as a diffusion-barrier layer on an impurity area 22 formed on a silicon substrate 20. A tungsten layer 26 is then formed as a metal wiring layer. In such a method, the tungsten layer 24, which acts as an ohmic layer, is formed to a thickness of 200–1500 Å by flowing tungsten fluoride ($WF_6$) at 6 sccm and hydrogen ($H_2$) at 200 sccm, respectively, at a deposition temperature of 6000° C. under a pressure of 0.1 Torr. Then, the tungsten nitride layer 25, which acts as a diffusion-barrier layer, is deposited to a thickness of 150–900 Å. Then a tungsten layer 26 is deposited to a thickness of 1000 Å or more on the tungsten nitride layer 25. The layers are then etched back to complete the metal wiring.

A section of the metal wiring is shown in a scanning electron microscopy (SEM) photo of FIG. 2B. While the tungsten layer formed as an ohmic layer shows excellent adhesion to silicon, the reduction reaction of tungsten with silicon forms tungsten silicide which leads to encroachment on the silicon substrate and can lead to deterioration of the electrical characteristics the device. Encroachment on the substrate may become an even more serious problem in the ULSI era when junction depth is decreased to 0.1 $\mu m$ or below. Furthermore, since tungsten reacts with Si at 550° C. or above, it is difficult to apply the above described metal wiring fabrication method to a fabrication process of a semiconductor device if a subsequent step of the fabrication process must be performed at a temperature higher than 550° C. In view of these limitations, improvements are needed in methods of fabricating tungsten-based interconnections and wiring.

SUMMARY OF THE INVENTION

In light of the above discussion, one object of the present invention is to provide methods of forming a tungsten nitride interconnection.

Another object of the present invention is to provide interconnections with similar physical properties for the components which make up the interconnection.

Yet another object of the present invention is to provide tungsten nitride layers with reduced likelihood of encroachment on a substrate on which the layer is formed.

These and other objects and advantages of the present invention are provided by methods for fabricating a tungsten nitride layer in a semiconductor substrate with an insulating layer formed thereon. The methods include forming a contact hole through the insulating layer. A tungsten nitride layer is then selectively deposited only in the contact hole by selective combination of a gas mixture of a nitrogen-containing gas and a tungsten source gas so as to prevent formation of tungsten nitride on the insulating layer outside the contact hole.

By providing a method of fabricating the tungsten nitride layer without the need for CMP, the physical forces on the device during processing are reduced and the likelihood of damage from the CMP process is reduced. Furthermore, by controlling the location of the deposition through the control of the gas mixture the likelihood of encroachment on the substrate may be reduced.

In a further embodiment of the present invention the step of selectively depositing a tungsten nitride layer comprises selectively combining a gas mixture of a nitrogen-containing gas, a tungsten source gas and a reducing agent gas so as to prevent formation of tungsten nitride layer on the insulating layer outside the contact hole.

In a particular embodiment of the present invention selective deposition is carried out by placing the semiconductor device in a process chamber. Nitrogen containing gas is injected into the process chamber at a controlled flow rate. Tungsten source gas is also injected into the process chamber at a controlled flow rate. Finally, a reducing agent gas is injected into the process chamber at a controlled flow rate. The flow rate of the nitrogen containing gas, the flow rate of the tungsten source gas and the flow rate of the reducing agent are controlled so as to control the location for formation of the tungsten nitride layer.

In another embodiment of the present invention a conductive layer is formed of a material selected from the group consisting of aluminum (Al), tungsten (W), molybdenum (Mo), cobalt (Co), titanium (Ti), copper (Cu), platinum (Pt), a silicide compounds of aluminum, tungsten, molybdenum, cobalt, titanium, copper and platinum, and alloys of aluminum, tungsten, molybdenum, cobalt, titanium, copper and platinum and exposed by the contact hole. Also, the insulating layer may be formed of a material selected from the group consisting of silicon oxide, a silicon nitride, silicon oxide with impurities implanted therein and silicon nitride with impurities implanted therein.

In particular embodiments of the present invention the tungsten source gas is selected from the group consisting of $WF_6$ and $WCl_6$. Also, the nitrogen-containing gas may be selected from the group consisting of $N_2$, $NH_3$, and methyl hydrazine. The reducing agent gas may be selected from the group consisting of $H_2$, $SiH_4$, $SiH_2Cl_3$, $SiH_2Cl_2$, and $PH_3$. Preferably, the flow rate of the nitrogen-containing gas is about 0.5 to 100 times the flow rate of the tungsten source gas. Even more preferred is a flow rate of the nitrogen-containing gas of about 2 to 7 times the flow rate of the tungsten source gas. A flow rate of the reducing agent gas is preferably about 0 to 500 times the flow rate of the tungsten source gas and more preferably about 20 to 50 times the flow rate of the tungsten source gas.

In another embodiment of the present invention the contact hole is formed so as to extend into a conductive region so as to provide a portion of a side-wall of the contact hole formed of the conductive material. Additionally, an ohmic layer may be formed by forming a titanium silicide layer in the contact hole prior to said step of selectively depositing a tungsten nitride layer. Embodiments of the present invention may also include the step of forming a metal layer in-situ in the contact hole after selectively depositing a tungsten nitride layer. The metal layer is preferably formed of a material selected from the group consisting of aluminum (Al), tungsten (W), molybdenum (Mo), cobalt (Co), titanium (Ti), copper (Cu), platinum (Pt), a silicide compound of aluminum (Al), tungsten (W), molybdenum (Mo), cobalt (Co), titanium (Ti), copper (Cu) and platinum (Pt), and an alloy of aluminum (Al), tungsten (W), molybdenum (Mo), cobalt (Co), titanium (Ti), copper (Cu) and platinum (Pt).

In another aspect of the present invention, a method for fabricating metal wiring for a semiconductor device is provided which includes forming a contact hole through an insulating layer to expose a conductive region. An ohmic layer is formed of a tungsten compound on the conductive region exposed by the contact hole. A tungsten nitride layer is formed on the ohmic layer by combining a nitrogen-containing gas and a tungsten source gas. A metal layer is then formed on the tungsten nitride layer. The steps of forming a tungsten nitride layer and forming a metal layer may be performed in-situ in the same process chamber.

In a further embodiment, the step of forming a tungsten nitride layer comprises forming a tungsten nitride layer on the ohmic layer in-situ by combining a nitrogen-containing gas, a tungsten source gas and a reducing agent gas. In a particular embodiment, the step of forming a tungsten nitride layer includes placing the semiconductor device in a process chamber and injecting nitrogen containing gas into the process chamber at a controlled flow rate, injecting a tungsten source gas into the process chamber at a controlled flow rate and injecting a reducing agent gas into the process chamber at a controlled flow rate. The flow rate of the nitrogen containing gas, the flow rate of the tungsten source gas and the flow rate of the reducing agent are controlled so as to control the location of formation of the tungsten nitride layer.

In particular embodiments of the present invention the tungsten compound is selected from the group consisting of tungsten, tungsten silicide, and tungsten nitride. Also the conductive region may be formed of silicon doped with $P^+$ dopants. The conductive region may also be formed of a material selected from the group consisting of aluminum (Al), tungsten (W), molybdenum (Mo), cobalt (Co), titanium (Ti), copper (Cu), platinum (Pt), a silicide compound of aluminum (Al), tungsten (W), molybdenum (Mo), cobalt (Co), titanium (Ti), copper (Cu) and platinum (Pt), and an alloy of aluminum (Al), tungsten (W), molybdenum (Mo), cobalt (Co), titanium (Ti), copper (Cu) and platinum (Pt). The insulating layer may be formed of a material selected from the group consisting of silicon oxide, silicon nitride, silicon oxide having implanted impurities and silicon nitride having implanted impurities.

In a further embodiment of the present invention, the step of forming an ohmic layer comprises the steps of depositing a tungsten nitride layer on the conductive layer exposed by the contact hole and forming an ohmic layer of tungsten silicide by thermally treating the tungsten nitride layer and the conductive layer so that tungsten of the tungsten nitride layer reacts with silicon of the conductive region to produce a tungsten silicide layer.

The tungsten source gas may be selected from the group consisting of $WF_6$ and $WCl_6$. The nitrogen-containing gas may be selected from the group consisting of $N_2$, $NH_3$, and methyl hydrazine. Also, the reducing agent gas may selected from the group consisting of $H_2$, $SiH_4$, $SiH_2Cl_3$, $SiH_2Cl_2$, and $PH_3$. The flow rate of the nitrogen-containing source gas is preferably about 0.5 to 100 times the flow rate of the tungsten source gas. The flow rate of the reducing agent gas is preferably about 0 to 500 times the flow rate of the tungsten source gas.

As described herein, utilizing the methods of the present invention a $WN_x$ layer can be selectively formed only within a contact hole and on a silicon substrate exposed by the contact hole or an underlying metal wiring layer. Thus, lifting that occurs to conventional metal wiring layers may be prevented by the methods of the present invention because of the similar physical characteristics of the materials of the metal wiring layer and the tungsten nitride diffusion-barrier layer. These similar physical characteristics result from forming the metal wiring layer as a W layer after formation of the $WN_x$ layer as a diffusion-barrier layer. When an ohmic layer is formed according to particular embodiments of the present invention, substrate encroachment may be reduced and a stable semiconductor device can be formed after formation of the wiring layer utilizing high temperature processes. In addition, the increase of contact resistance resulting from the formation of the ohmic layer using a Ti layer may be reduced.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE PREFERRED EMBODIMENTS

Figure 1A:
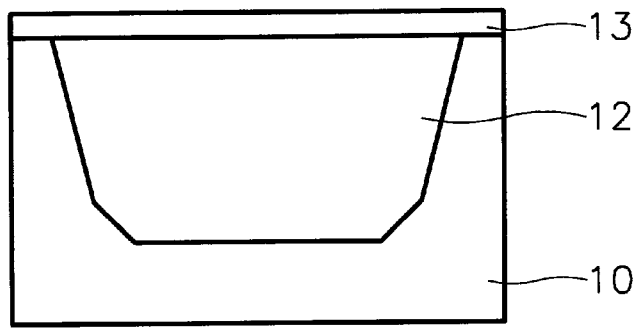
FIGS. 1A through 1E are cross-sectional views explaining a conventional method for fabricating a metal wiring structure of Ti/TiN/W.
Figure 1B:
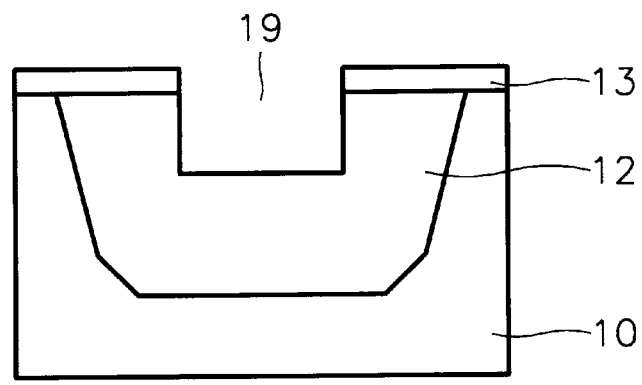
Figure 1C:
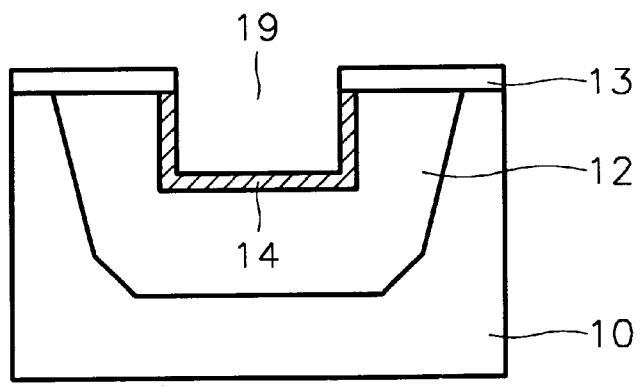
Figure 1D:
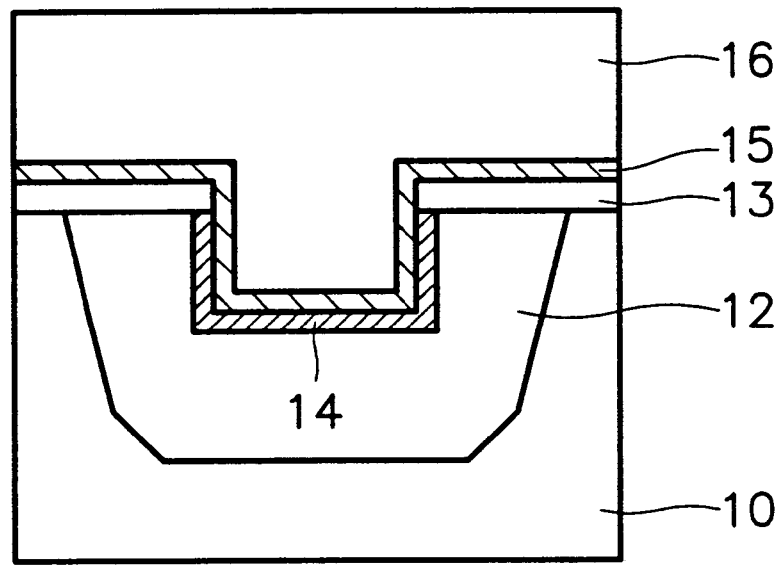
Figure 1E:
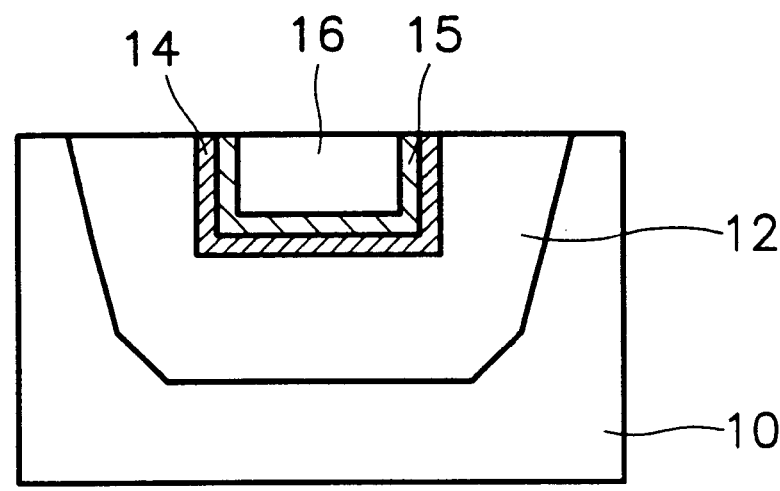
Figure 2A:
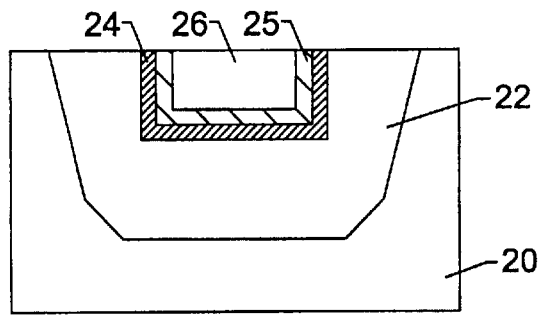
FIG. 2A is a cross-sectional view explaining a conventional method for fabricating a metal wiring structure of $W/WN_x/W$

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
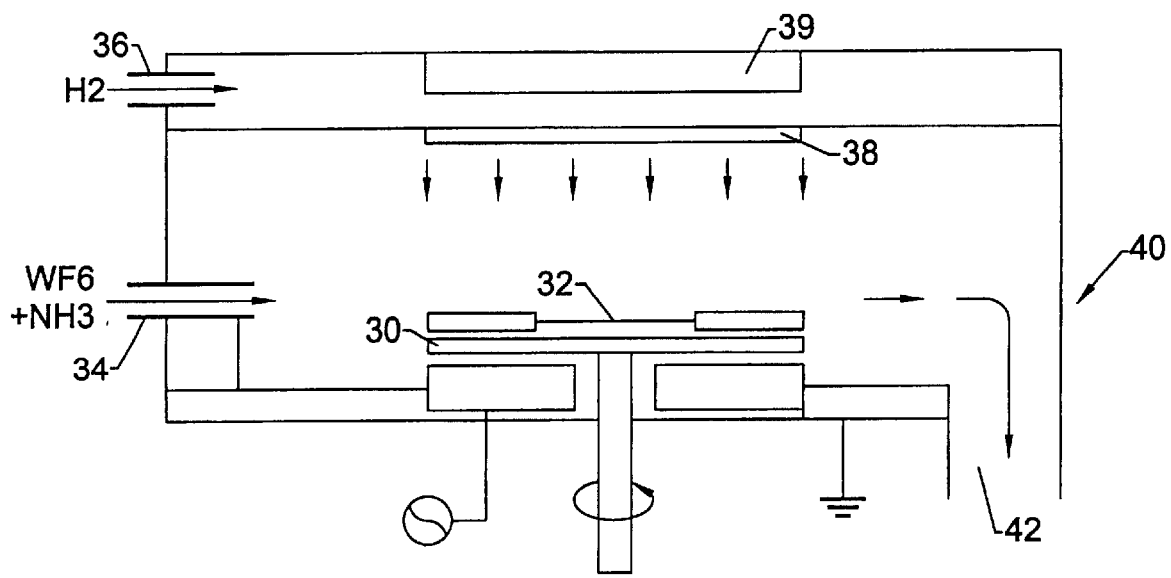
FIG. 3 is a cross-sectional view of a process chamber for depositing a $WN_x$ layer according to the present invention.
Figure 2B:
FIG. 2B is an SEM photo showing a section of the metal wiring shown in FIG. 2A.

FIG. 3 is a cross-sectional view of a CVD process chamber which may be used for depositing a $WN_x$ layer utilizing methods according to the present invention. As will be appreciated by those of skill in the art, the subscript "x" used in reference to tungsten nitride ($WN_x$) will depend upon the valence state of tungsten utilized in the formation of tungsten nitride in a manner which is known to those of skill in the art.

Referring to FIG. 3, a susceptor 30, for receiving a semiconductor wafer 32, is installed in the lower part of a process chamber 40. An IR lamp 39 is installed in the upper part of the process chamber 40 to heat the wafer 32 to a temperature appropriate for reaction. A tungsten source gas and a nitrogen-containing gas are injected through a first gas inlet 34 and flow horizontally across the wafer 32 loaded on the susceptor 30. A reducing agent gas is injected through a second gas inlet 36 and flows vertically to the wafer 32 through a mesh nozzle 38. The reducing agent reacts with the gases introduced from the first gas inlet 34 to form a $WN_x$ layer on the wafer 32. The gases are exhausted through an outlet 42 opposite the first and second gas inlets 34 and 36. Contamination sources which might be produced in the process chamber 40 are minimized by bringing the process chamber pressure of the process chamber 40 to a near vacuum of $10^{-6}$ Torr or below.

To form a $WN_x$ layer according to the present invention utilizing the process chamber 40, the susceptor 30 is loaded with a silicon substrate having a doped impurity region or a silicon substrate which includes an underlying metal wiring layer which is formed of a pure metal such as aluminum (Al), tungsten (W), molybdenum (Mo), cobalt (Co), titanium (Ti), copper (Cu), and platinum (Pt), their silicide compound, or their alloys. The process chamber 40 is heated to 200–700° C. by the IR lamp 39 and reactive gases are introduced through the first and second gas inlets 34 and 36, preferably at a pressure of 0.01–1 Torr. It is preferable to use $WF_6$ or $WCl_6$ as the tungsten source gas and methyl hydrazine, $N_2$, or $NH_3$ as the nitrogen-containing gas injected through the first gas inlet 34. Preferably, one of $H_2$, $SiH_4$, $SiH_2Cl_3$, $SiH_2Cl_2$, and $PH_3$ is used as the reducing agent gas injected through the second gas inlet 36. The flow-rate of the nitrogen-containing gas is preferably about 0.5 to 100 times the flow rate of the tungsten source gas, and more preferably about 2 to 7 times the flow rate of the tungsten source gas. The flow-rate of the reducing agent gas is preferably about 0 to 500 times the flow rate of the tungsten source gas, and more preferably about 20 to 50 times the flow rate of the tungsten source gas. As will be appreciated by those of skill in the art, these flow rates are based upon the use of substantially homogeneous gases such that if the tungsten source gas, nitrogen containing gas or reducing agent gas are made up of a combination of gases differing flow rate ratios may be required. For example, if an inert gas is mixed with $NH_3$ a different flow rate of this inert gas would be required than if pure $NH_3$ were utilized.

FIGS. 4A to 4D are SEM photos showing the growth of $WN_x$ layers utilizing differing flow-rate ratios of nitrogen containing gas ($NH_3$) to tungsten source gas. The $WN_x$ layers shown in FIGS. 4A to 4D were formed by varying the flow-rate of the nitrogen containing gas ($NH_3$) to 0, 10, 20, and 40 sccm, while maintaining the other processing conditions fixed. The deposition temperature was 600° C., the pressure was 0.1 Torr, the flow rate of tungsten source gas ($WF_6$) was 6 sccm, and the flow rate of reducing agent gas ($H_2$) was 200 sccm. The results are illustrated in the SEM photos of FIGS. 4A to 4D.

Figure 4A:
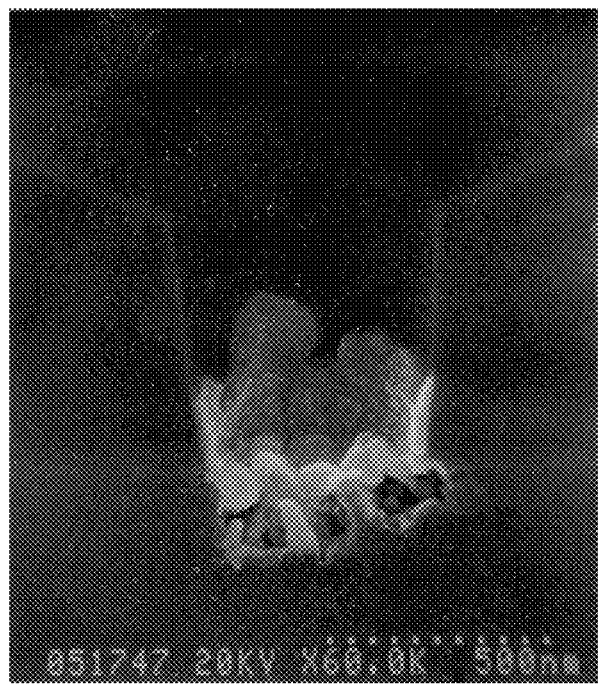
FIGS. 4A through 4D are SEM photos showing sections of a TiN layer which selectively grows according to the flow rate of $NH_3$ gas.
Figure 4B:
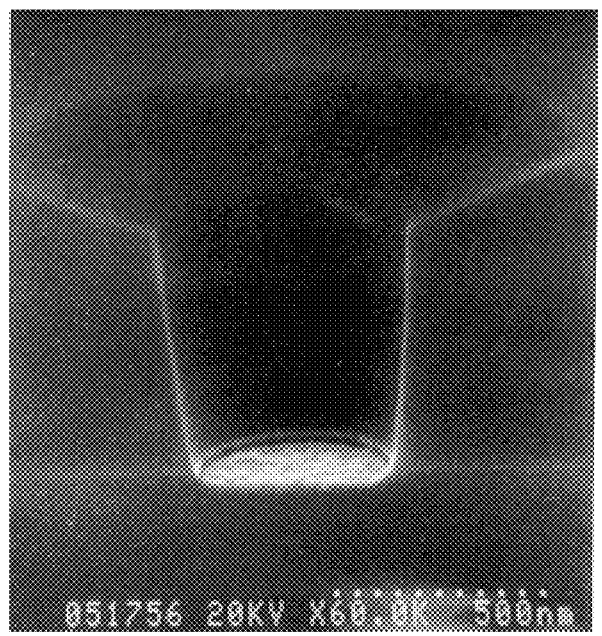
Figure 4C:
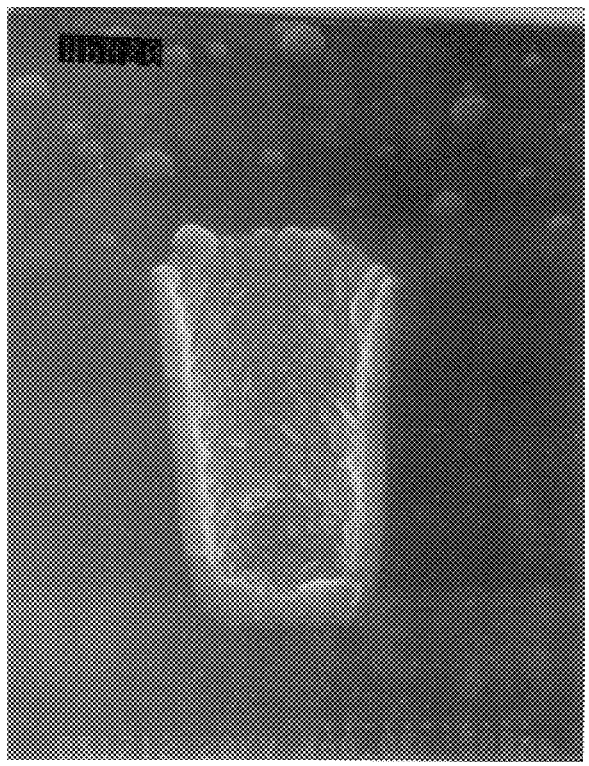
Figure 4D:
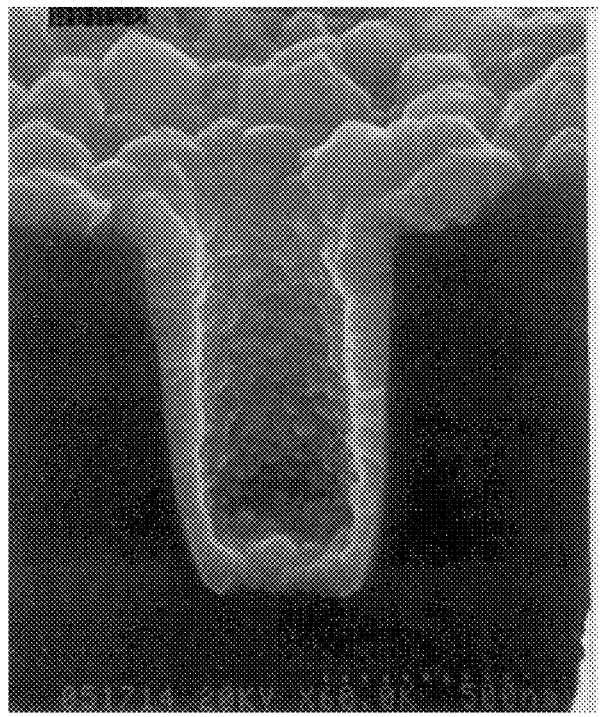

As seen in FIG. 4A, a pure tungsten layer was formed in the contact hole, however, the tungsten layer seriously encroached on the substrate, which is a problem of the prior art. On the other hand, with a flow-rate of $NH_3$ of 10 sccm, the encroachment was suppressed, as shown in FIG. 4B, and a nucleus was formed only on the bottom surface of the contact hole. With a flow-rate of $NH_3$ of 20 sccm, a $WN_x$ layer grew only on the substrate portion and sidewalls of the contact hole, not on the silicon oxide layer formed on the substrate, as shown in FIG. 4C. However, as shown in FIG. 4D, with a flow-rate of $NH_3$ of 40 sccm the above characteristics of selective deposition of the $WN_x$ layer were not present.

Figure 5:
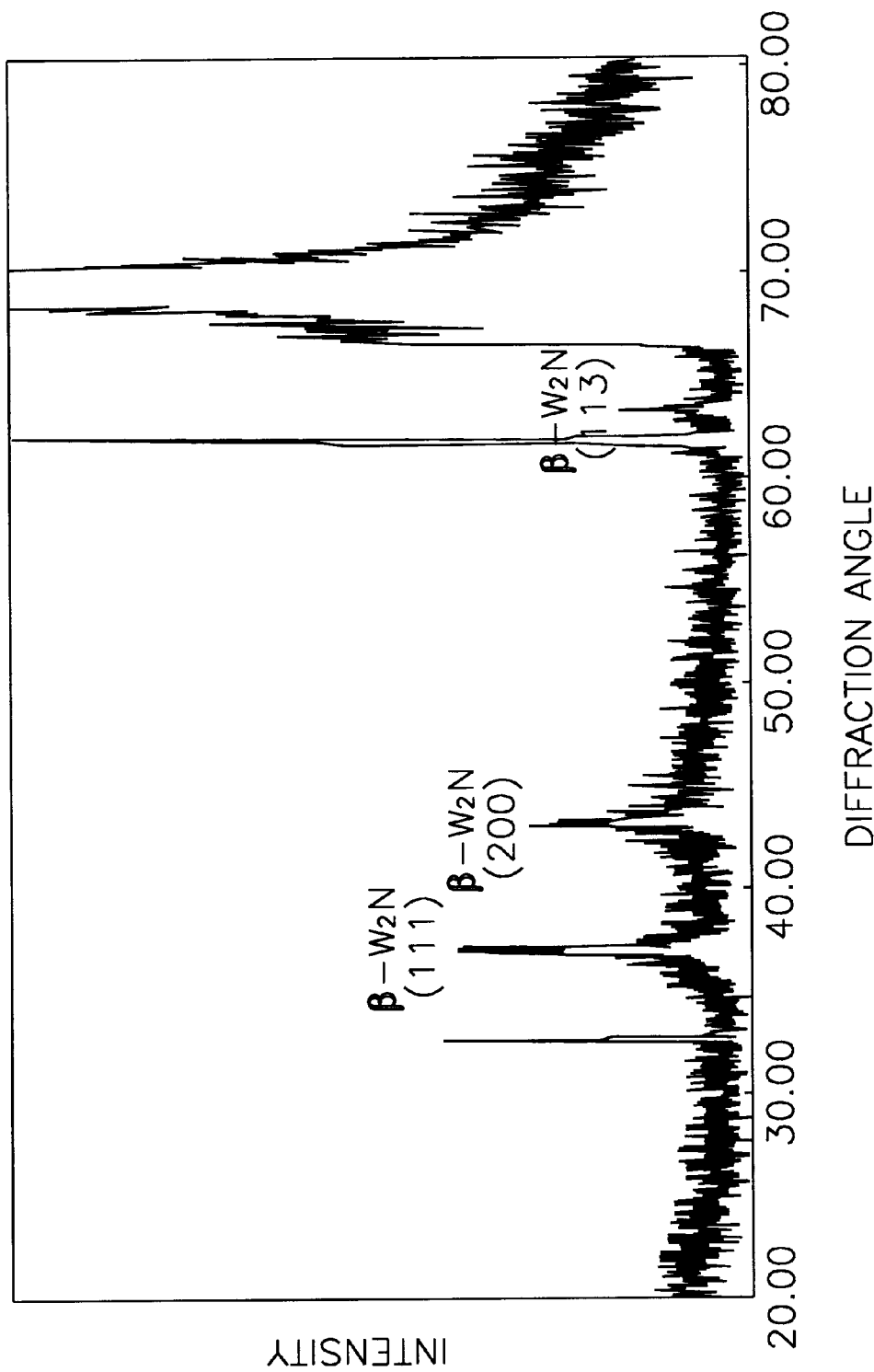
FIG. 5 is a graph showing X-ray diffraction results of the $WN_x$ layer formed according to the present invention.

As is illustrated by the above examples, a $WN_x$ layer can be selectively grown only in a contact hole by adjusting the flow-rate ratio of the nitrogen-containing gas to the tungsten source gas. FIG. 5 further illustrates this selective growth. FIG. 5 shows the X-ray diffraction results of the $WN_x$ process of FIG. 4C. In FIG. 5, three peaks of a $\beta$-$W_2N$ phase and different crystal orientations are shown, which indicates that the $WN_x$ layer was selectively formed on a silicon substrate.

One particularly beneficial use of the $WN_x$ fabrication method described above is in the fabrication of metal wiring. Methods for fabricating metal wiring for a semiconductor device using the above $WN_x$ layer fabrication method will be described with reference to FIGS. 6A to 8E.

Figure 6A:
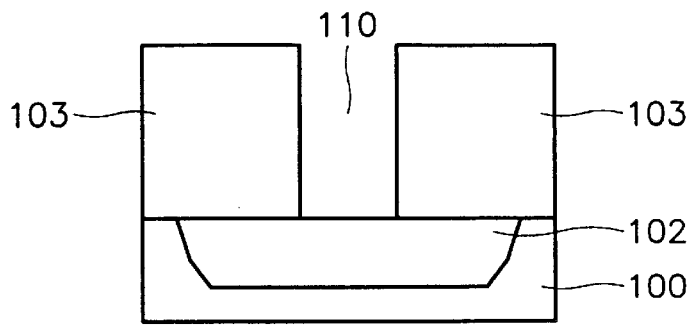
FIGS. 6A through 6D are cross-sectional views of a method for fabricating a metal wiring of a semiconductor device according to one embodiment of the present invention.

Referring to FIG. 6A, an insulating layer 103, for example, a silicon oxide layer, is formed to a thickness of about 500–2000 Å on a silicon substrate 100 having an impurity region 102 formed therein. The silicon oxide layer serving as the insulating layer 103 layer can be replaced by other materials known to those of skill in the art to act as an insulating layer, such as a silicon nitride layer or a layer obtained by implanting impurities into a silicon oxide layer or a silicon nitride layer. A contact hole 110 is formed through the insulating layer 103 to expose the impurity region 102 by dry etching the insulating layer 103 by photolithography or such other suitable processing as is known to those of skill in the art for forming a contact hole through an insulating layer.

Figure 6B:
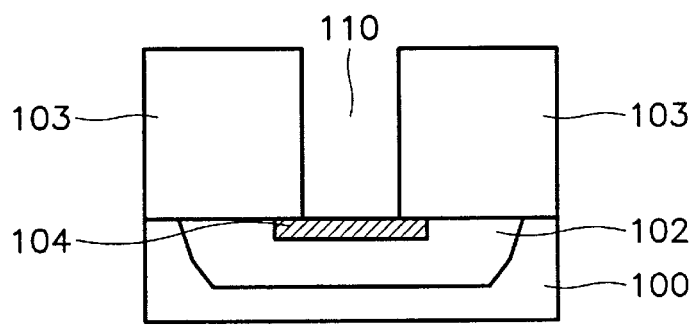

Referring to FIG. 6B, a Ti layer is deposited to a thickness of 200–1500 Å on the insulating layer 103 and in the contact hole 110. Titanium layer and the silicon substrate are thermally treated so that the Ti layer and reacts with the silicon substrate 100 exposed by the contact hole 110, thereby forming a $TiSi_x$ layer 104 only on the contact surface between the contact hole 110 and the silicon substrate 100. The remaining Ti which did not react with the substrate is removed by wet etching. The $TiSi_x$ layer 104 functions as an ohmic layer.

Figure 6C:
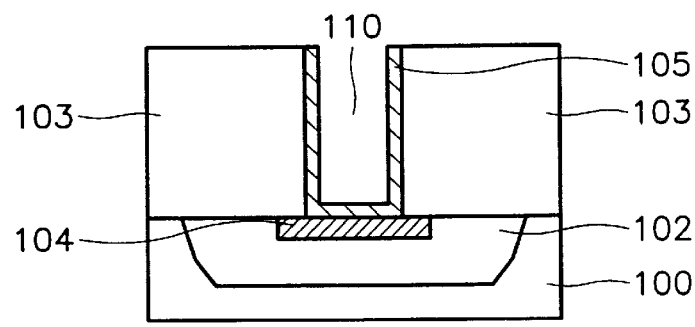

Referring to FIG. 6C, the silicon substrate 100 is heated to 200–700° C., and the substrate 100 exposed by the contact hole 110 and the sidewalls of the insulating layer 103 are selectively deposited with $WN_x$ layer 105 by flowing a nitrogen-containing gas, a tungsten source gas, and a reducing agent gas onto the silicon substrate 100. The flow rate of the nitrogen-family gas is about 0.5 to 100 times that of the tungsten source gas, and the flow-rate of the reducing agent gas is about 0 to 500 times the flow rate of the tungsten source gas.

Figure 6D:
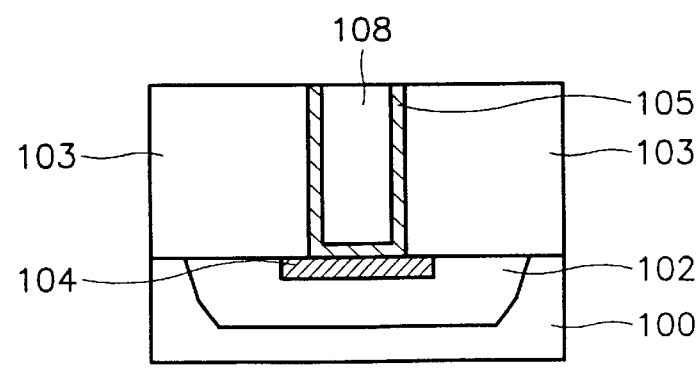

Referring to FIG. 6D, after the $WN_x$ layer 105 is formed, a metal layer 108 is deposited only in the contact hole 110 by an in-situ method, thereby forming the metal wiring. Here, the metal layer is preferably formed of a pure metal such as Al, W, Mo, Co, Ti, Cu, and Pt, their silicide compounds or their alloys.

Figure 7A:
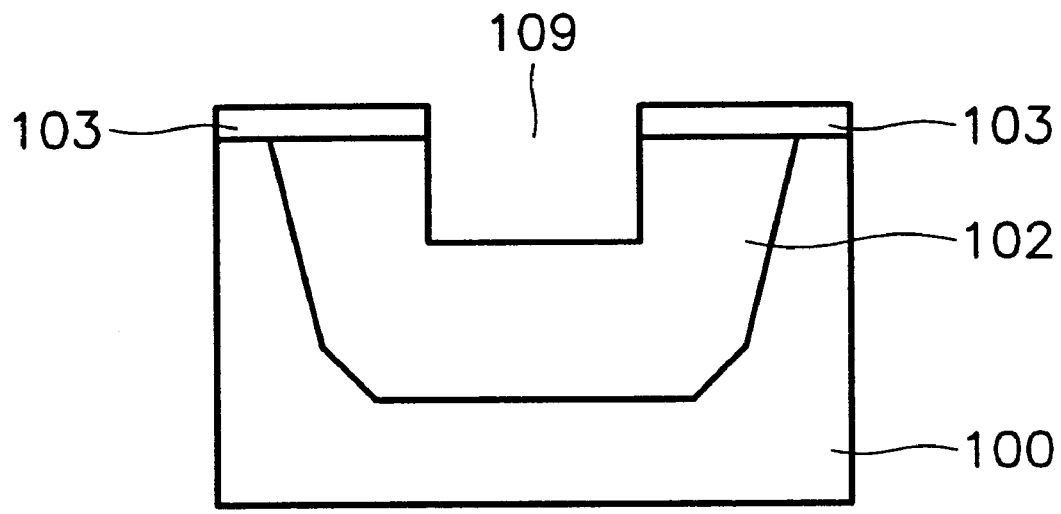
FIGS. 7A and 7B are cross-sectional views of a method for fabricating a metal wiring of a semiconductor device according to an alternative embodiment of the present invention.
Figure 7B:
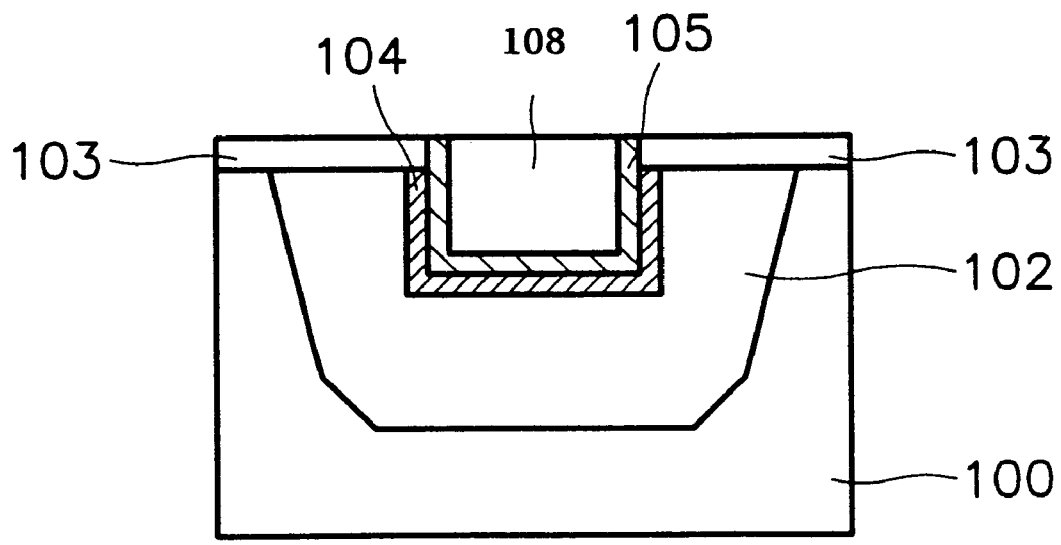

FIGS. 7A and 7B illustrate an alternative embodiment of the present invention. This alternative embodiment differs from the embodiment described above in that the trench 109 is formed by etching through the insulating layer 103 and into the doped region 102 of the substrate 100. The trench extending into the substrate 100 is shown in FIG. 7A.

After formation of the trench 109, as seen in FIG. 7B, the $TiSi_x$ layer 104 is formed as a ohmic layer which extends onto the sidewalls of the substrate portion of the trench. The $TiSi_x$ layer 104 is formed as described above with respect to FIG. 6B. The $WN_x$ layer 105 is formed as a diffusion-barrier layer as described above with respect to FIG. 6C, and a tungsten layer 108 as a metal layer is formed as described above with respect to FIG. 6D.

FIGS. 8A through 8E illustrate another embodiment of the present invention. In the embodiment of the present invention illustrate in FIGS. 8A through 8E, instead of the $TiSi_x$ layer as an ohmic layer, tungsten or a tungsten compound such as tungsten silicide is deposited by CVD to thereby lower contact resistance. A $WN_x$ layer acting as a diffusion-barrier layer is deposited in-situ by CVD.

Figure 8A:
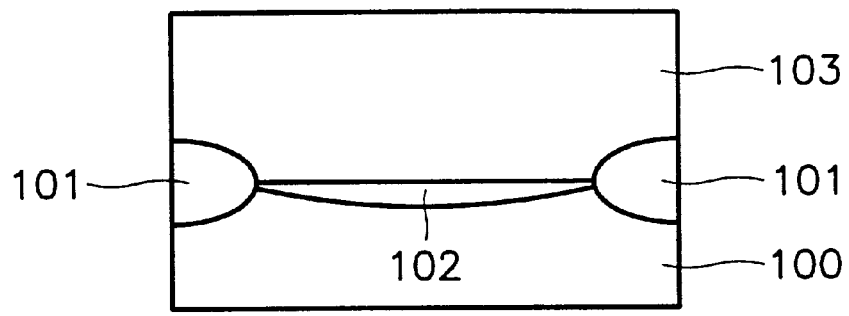
FIGS. 8A through 8E are cross-sectional views of a method for fabricating a metal wiring of a semiconductor device according to a second alternative embodiment of the present invention.

Referring to FIG. 8A, after a device isolation region 101 is formed on the silicon substrate 100 to isolate active regions from each other following a general device isolation process, an impurity region, for example, an $N^+$ or $P^+$ junction 102 is formed in an active region by ion implantation or other such methods known to those of skill in the art. The insulating layer 103, for example, BPSG is formed on the impurity region and the isolation regions so that any steps are planarized.

Figure 8B:
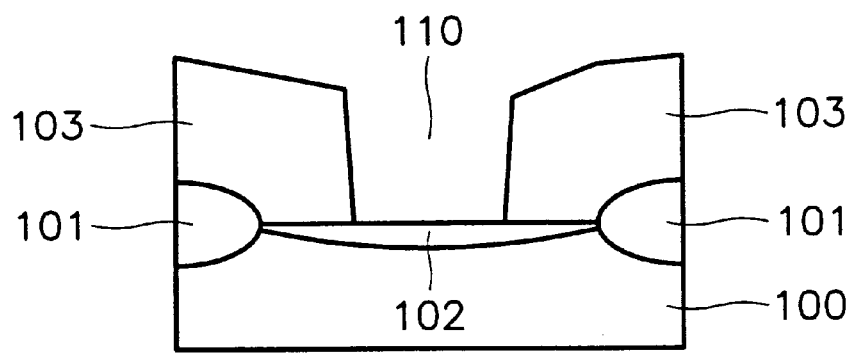

Referring to FIG. 8B, the insulating layer 103 is etched by photolithography or such other techniques as are known to those of skill in the art to form the contact hole 110. Contact hole 110 exposes the impurity region 102 of the silicon substrate 100.

Figure 8C:
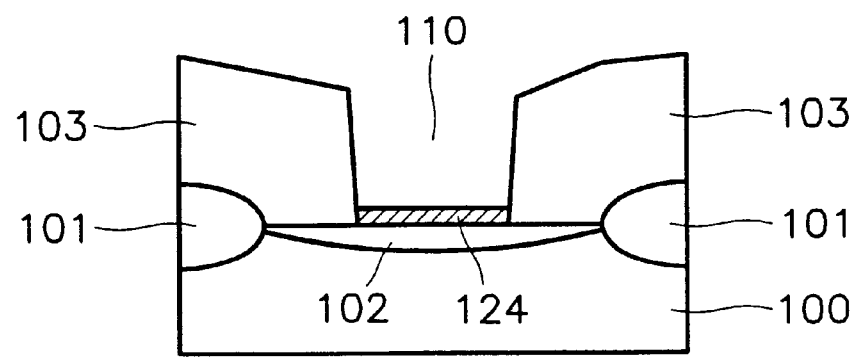

Referring to FIG. 8C, a tungsten-containing ohmic layer 124 is formed by CVD in the contact hole 110. The ohmic layer 124 can be formed by depositing the tungsten ohmic layer 124 by flowing a tungsten source gas into the process chamber for a period of time short enough to not result in encroachment on the silicon.

Alternatively, the ohmic layer 124 may formed by selective deposition of tungsten only on the bottom of the contact hole 110 by setting the flow-rate of the nitrogen-containing gas is preferably 2 or less times the flow rate of the tungsten source gas. Then, the $WN_x$ layer 125 illustrated in FIG. 8D may be formed in the contact hole 110 by increasing the flow rate of the nitrogen-containing gas so as to set the flow-rate of the nitrogen-family gas to about 2 to 100, more preferably 2 to 7 times the flow rate of the tungsten source gas.

A third method of forming the ohmic layer 124 is to mix $SiH_4$ or $SiH_2Cl_2$ with the tungsten source gas, depositing the mixture gas at 500° C. or above, and thus forming tungsten silicide as the ohmic layer 124. Additionally, a $WN_x$ layer may be directly deposited on the silicon substrate and annealed so that tungsten of the $WN_x$ layer reacts with the underlying silicon to form tungsten silicide as the ohmic layer 124.

Figure 8D:
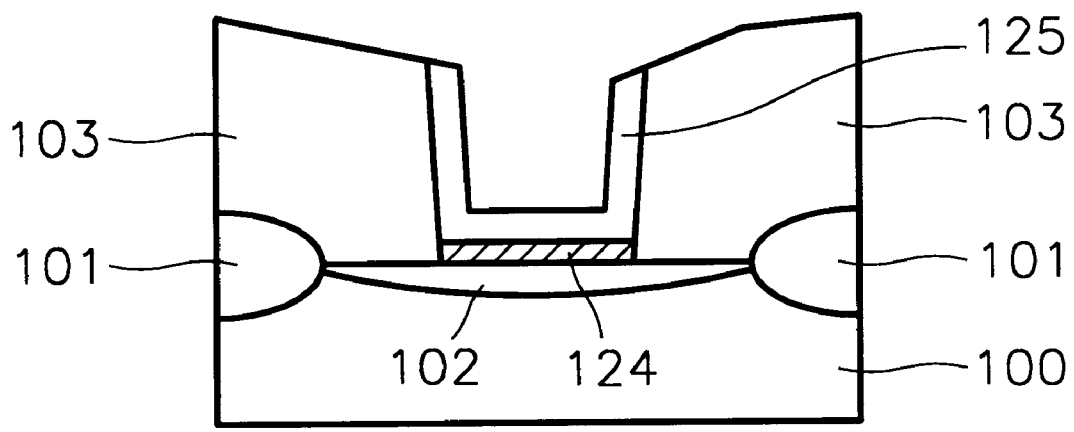

Referring now to FIG. 8D, a diffusion-barrier layer 125, which comprises a $WN_x$ layer, is deposited to a thickness of 500 Å or above, preferably in the same process chamber in which the ohmic layer 124 is deposited, in the same manner as described above with respect to FIGS. 6A to 6D.

Figure 8E:
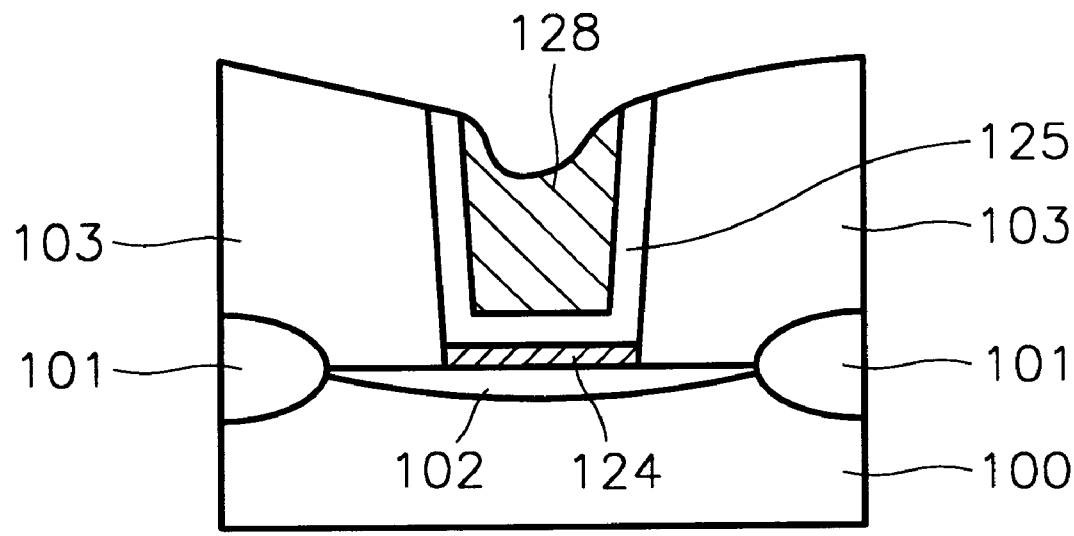

Referring to FIG. 8E, a metal wiring layer 128 is deposited on the barrier layer 125. The metal wiring layer 128 is preferably formed by depositing a wiring metal such as Al or Cu.

That which is claimed:

1. A method for fabricating a tungsten nitride layer in a semiconductor substrate having an insulating layer formed thereon, comprising the steps of:

forming a contact hole through the insulating layer;

forming an ohmic layer by forming a titanium silicide layer in the contact hole; and then selectively depositing a tungsten nitride layer only in the contact hole and sidewalls of the contact hole by selectively reacting a nitrogen-containing gas and a tungsten source gas by controlling flow rates of the nitrogen-containing gas and the tungsten source gas such that the flow rate of the nitrogen containing gas is from about 2 to about 7 times the flow rate of the tungsten source gas, so as to prevent formation of tungsten nitride layer on the insulating layer outside the contact hole.

2. A method of fabricating a tungsten nitride layer according to claim 1, wherein said step of selectively depositing a tungsten nitride layer comprises selectively reacting a gas mixture of a nitrogen-containing gas and a tungsten source gas with a reducing agent gas thereby facilitating the reaction of the nitrogen-containing gas with the tungsten source gas.

3. A method of fabricating a tungsten nitride layer according to claim 2, wherein said step of selectively reacting comprises the steps of:

placing the semiconductor substrate in a process chamber;

injecting nitrogen containing gas into the process chamber at a controlled flow rate;

injecting a tungsten source gas into the process chamber at a controlled flow rate;

injecting a reducing agent gas into the process chamber at a controlled flow rate; and wherein the flow rate of the nitrogen containing gas, the flow rate of the tungsten source gas and the flow rate of the reducing agent gas are controlled so as to prevent formation of tungsten nitride on the insulating layer outside the contact hole.

4. A method for fabricating a tungsten nitride layer according to claim 1, wherein a conductive layer is formed of a material selected from the group consisting of aluminum (Al), tungsten (W), molybdenum (Mo), cobalt (Co), titanium (Ti), copper (Cu), platinum (Pt), a silicide compounds of aluminum, tungsten, molybdenum, cobalt, titanium, copper and platinum, and alloys of aluminum, tungsten, molybdenum, cobalt, titanium, copper and platinum and exposed by the contact hole.

5. A method for fabricating a tungsten nitride layer according to claim 1, wherein the insulating layer is formed of a material selected from the group consisting of silicon oxide, silicon nitride, doped silicon oxide and doped silicon nitride.

6. A method for fabricating a tungsten nitride layer according to claim 1, wherein the tungsten source gas is selected from the group consisting of $WF_6$ and $WCl_6$.

7. A method for fabricating a tungsten nitride layer according to claim 1, wherein the nitrogen-containing gas is selected from the group consisting of $N_2$, $NH_3$, and methyl hydrazine.

8. A method for fabricating a tungsten nitride layer according to claim 2, wherein said reducing agent gas is selected from the group consisting of $H_2$, $SiH_4$, $SiH_2Cl_2$, and $PH_3$.

9. A method for fabricating a tungsten nitride layer according to claim 3, wherein the flow rate of the nitrogen-containing gas is from about 0.5 to about 100 times the flow rate of the tungsten source gas.

10. A method for fabricating a tungsten nitride layer according to claim 3, wherein the flow rate of the reducing agent gas is from about 0 to about 500 times the flow rate of the tungsten source gas.

11. A method for fabricating a tungsten nitride layer according to claim 10, wherein the flow-rate of the reducing agent gas is from about 20 to about 50 times the flow rate of the tungsten source gas.

12. A method for fabricating a tungsten nitride layer according to claim 1, wherein the contact hole is formed so as to extend into a conductive region exposed by the contact hole so as to provide a portion of a side-wall of the contact hole formed of a conductive material.

13. A method for fabricating metal wiring for a semiconductor device, comprising the steps of:

(a) forming a contact hole through an insulating layer to expose a conductive region;

(b) forming an ohmic layer of tungsten silicide on the conductive region exposed by the contact hole;

(c) forming, in a process chamber, a tungsten nitride layer on the ohmic layer and sidewalls of the contact hole by selectively reacting a nitrogen-containing gas and a tungsten source gas at a temperature in a range of from about 200 to about 700° C. by controlling flow rates of the nitrogen-containing gas and the tungsten source gas so that the flow rate of the nitrogen-containing gas is from about 2 to about 7 times the flow rate of the tungsten source gas, so as to control the location for formation of the tungsten nitride layer to prevent formation of a tungsten nitride layer on the insulating layer outside the contact hole; and (d) forming a metal layer on the tungsten nitride layer in situ in the same process chamber.

14. A method of fabricating metal wiring according to claim 13, wherein said step of forming a tungsten nitride layer comprises depositing a tungsten nitride layer on the ohmic layer in-situ by selectively reacting a gas mixture of a nitrogen-containing gas and a tungsten source gas with a reducing agent gas.

15. A method of fabricating metal wiring according to claim 14, wherein said step of forming a tungsten nitride layer comprises the following steps:

placing the semiconductor device in a process chamber;

injecting nitrogen containing gas into the process chamber at a controlled flow rate;

injecting a tungsten source gas into the process chamber at a controlled flow rate;

injecting a reducing agent gas into the process chamber at a controlled flow rate; and wherein the flow rate of the nitrogen containing gas, the flow rate of the tungsten source gas and the flow rate of the reducing agent gas are controlled so as to control the location for formation of the tungsten nitride layer.

16. A method of fabricating metal wiring for a semiconductor device according to claim 13, wherein the conductive region comprises doped silicon and wherein said step of forming an ohmic layer comprises the steps of:

depositing a tungsten nitride layer on the conductive layer exposed by the contact hole; and forming an ohmic layer of tungsten silicide by thermally treating the tungsten nitride layer and the conductive layer so that tungsten of the tungsten nitride layer reacts with silicon of the conductive layer to produce a tungsten silicide layer.

17. A method of fabricating metal wiring for a semiconductor device according to claim 13, wherein the conductive region is formed of silicon doped with $P^+$ impurities.

18. A method of fabricating metal wiring for a semiconductor device according to claim 13, wherein the conductive region is formed of a material selected from the group consisting of aluminum (Al), tungsten (W), molybdenum (Mo), cobalt (Co), titanium (Ti), copper (Cu), platinum (Pt), a silicide compound of aluminum (Al), tungsten (W), molybdenum (Mo), cobalt (Co), titanium (Ti), copper (Cu) and platinum (Pt), and an alloy of aluminum (Al), tungsten (W), molybdenum (Mo), cobalt (Co), titanium (Ti), copper (Cu) and platinum (Pt).

19. A method of fabricating metal wiring for a semiconductor device according to claim 13, wherein the insulating layer is formed of a material selected from the group consisting of silicon oxide, silicon nitride, doped silicon oxide and doped silicon nitride.

20. A method of fabricating metal wiring for a semiconductor device according to claim 13, wherein the tungsten source gas is selected from the group consisting of $WF_6$ and $WCl_6$.

21. A method of fabricating metal wiring for a semiconductor device according to claim 13, wherein the nitrogen-containing gas is selected from the group consisting of $N_2$, $NH_3$, and methyl hydrazine.

22. A method of fabricating metal wiring for a semiconductor device according to claim 14, wherein the reducing agent gas is selected from the group consisting of $H_2$, $SiH_4$, $SiH_2Cl_2$, and $PH_3$.

23. A method of fabricating metal wiring for a semiconductor device according to claim 15, wherein the flow rate of the reducing agent gas is from about 0 to about 500 times the flow rate of the tungsten source gas.

24. A method of fabricating metal wiring for a semiconductor device according to claim 13, wherein the metal layer is formed of a material selected from the group consisting of aluminum (Al), tungsten (W), molybdenum (Mo), cobalt (Co), titanium (Ti), copper (Cu), platinum (Pt), a silicide compound of aluminum (Al), tungsten (W), molybdenum (Mo), cobalt (Co), titanium (Ti), copper (Cu) and platinum (Pt), and an alloy of aluminum (Al), tungsten (W), molybdenum (Mo), cobalt (Co), titanium (Ti), copper (Cu) and platinum (Pt).

* * * * *